US010754149B2

(12) United States Patent
Zhou et al.

(10) Patent No.: US 10,754,149 B2
(45) Date of Patent: Aug. 25, 2020

(54) EFFICIENT RADIAL LENS SHADING CORRECTION

(71) Applicant: AMD (Shanghai) Co. Ltd., Shanghai (CN)

(72) Inventors: Hui Zhou, Shanghai (CN); Yang Ling, Shanghai (CN)

(73) Assignee: AMD (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/958,183

(22) Filed: Apr. 20, 2018

(65) Prior Publication Data

US 2019/0324268 A1    Oct. 24, 2019

(51) Int. Cl.
| | |
|---|---|
| *H04N 5/357* | (2011.01) |
| *H04N 5/235* | (2006.01) |
| *H04N 5/238* | (2006.01) |
| *H04N 5/217* | (2011.01) |
| *G06T 5/00* | (2006.01) |
| *G06T 3/40* | (2006.01) |
| *G02B 27/00* | (2006.01) |
| *H01L 27/146* | (2006.01) |

(52) U.S. Cl.
CPC ........ *G02B 27/0037* (2013.01); *G06T 3/4015* (2013.01); *G06T 5/007* (2013.01); *H01L 27/146* (2013.01); *H04N 5/3572* (2013.01)

(58) Field of Classification Search
CPC ...... H04N 5/235; H04N 5/238; H04N 5/3572; H04N 5/21; H04N 5/27; H04N 5/2176; G06T 5/08; G06T 5/002; G06T 5/006; G06T 3/4015

USPC ..... 348/251, 615, 229.1, 222.1, 207.99–376; 382/274; 315/251, 229.1, 222.1, 615; 359/16, 337, 637, 724

See application file for complete search history.

(56) References Cited

U.S. PATENT DOCUMENTS

| | | | |
|---|---|---|---|
| 7,453,502 B2 | 11/2008 | Schweng | |
| 7,538,806 B2 | 5/2009 | Kawakami et al. | |
| 7,548,262 B2 | 6/2009 | Nikkanen et al. | |
| 7,609,305 B2 | 10/2009 | Fainstain et al. | |
| 8,194,159 B2 * | 6/2012 | Wang | H04N 5/235 348/229.1 |

(Continued)

FOREIGN PATENT DOCUMENTS

WO    2016/065632 A1    5/2016

*Primary Examiner* — Marly S Camargo

(74) *Attorney, Agent, or Firm* — Faegre Drinker Biddle & Reath LLP

(57) ABSTRACT

Techniques for correcting image data in a lens shading correction circuit include accessing numerical constants associated with channels of a captured image represented by a pixel array from a memory. The techniques further include calculating lens shading correction factors for the captured image for each pixel of a channel in the pixel array according to the x-y pixel position of the pixel based on a lens shading correction formula and the numerical constants. For the channel in the pixel array, the correction formula applies different subsets of the numerical constants to different radial portions of the pixel array. The techniques also includes performing lens shading correction for the captured image based on the calculated lens shading correction factors to produce corrected image data, and storing the corrected image data in a non-transitory computer-readable medium.

20 Claims, 4 Drawing Sheets

(56) References Cited

U.S. PATENT DOCUMENTS

| | | | | |
|---|---|---|---|---|
| 8,228,406 B2* | 7/2012 | Kuo | ............... | H04N 5/3572 348/251 |
| 8,350,951 B2 | 1/2013 | Terasawa | | |
| 8,577,140 B2 | 11/2013 | Demandolx | | |
| 8,587,703 B2* | 11/2013 | Lelescu | ............... | H04N 5/3572 348/224.1 |
| 8,749,662 B2* | 6/2014 | Cabral | ............... | H04N 5/3572 348/224.1 |
| 8,804,013 B2 | 8/2014 | Park et al. | | |
| 9,386,262 B2 | 7/2016 | Yokoyama | | |
| 9,392,180 B2 | 7/2016 | Hsu | | |
| 9,699,428 B2* | 7/2017 | Bai | ............... | H04N 9/735 348/251 |
| 9,740,958 B2 | 8/2017 | Lee et al. | | |
| 10,171,786 B2* | 1/2019 | Bai | ............... | H04N 9/735 348/251 |
| 10,362,247 B2* | 7/2019 | Kim | ............... | H04N 5/3571 348/241 |
| 2002/0025164 A1* | 2/2002 | Suzuki | ............... | G03B 17/48 396/429 |
| 2002/0126209 A1* | 9/2002 | Hamada | ............... | H04N 5/20 348/219.1 |
| 2005/0179793 A1* | 8/2005 | Schweng | ............... | H04N 5/217 348/241 |
| 2008/0074515 A1* | 3/2008 | Takane | ............... | H04N 5/3572 348/251 |
| 2008/0204574 A1* | 8/2008 | Kyung | ............... | H04N 5/235 348/229.1 |
| 2011/0007969 A1* | 1/2011 | Park | ............... | G06K 9/40 382/274 |
| 2011/0304752 A1* | 12/2011 | Lee | ............... | H04N 5/3572 348/251 |
| 2013/0258135 A1* | 10/2013 | Hsu | ............... | H04N 5/2351 348/229.1 |
| 2015/0030258 A1 | 1/2015 | Chen et al. | | |
| 2017/0330308 A1 | 11/2017 | Chen et al. | | |
| 2019/0297281 A1* | 9/2019 | Kim | ............... | H04N 5/3572 348/241 |
| 2019/0297284 A1* | 9/2019 | Kim | ............... | H04N 5/357 348/224.1 |

\* cited by examiner

EFFICIENT RADIAL LENS SHADING CORRECTION

BACKGROUND OF THE DISCLOSURE

Lens shading correction is used to account for variation among gain across different pixels of a photodetector in the production of a digital image through image signal processing. Lens shading correction factors are represented with a correction gain profile from a standard light source for a lens and photodetector, or series of lens-photodetector assemblies manufactured under the same design and processes. In some implementations, the lens shading correction factors are stored as a look-up table with one value associated with each pixel of a photodetector. Generally, photodetectors include separate red, green, and blue pixel sensors, and the look-up table includes individual correction factors for each of the separate red, green, and blue pixel sensors.

In some implementations, the lens shading correction values are stored for only some of the pixels, and the correction factor for a given pixel are interpolated (such as bilinear interpolation) from the stored correction factors. This reduces the amount of data required for correction factors. Generally such stored correction factors are provided for multiple channels, such as R/G/G/B (a channel for a red sensor, two channels for two green sensors, and a channel for a blue sensor).

In one particular implementation, a grid of 17×17 sectors, each representing a sample area, with 4 channels, such as red, green, green, blue (R/G/G/B) for sensor raw data, are used. Such an example requires about 11560 bits, typically stored in static random access memory (SRAM), as each sample uses about 10 bits. In various implementations, more samples reduce error in the interpolated correction factors, whereas less samples reduce the data storage required.

In implementations with larger numbers of sectors, the precision of lens shading correction factors associated with pixels of a captured image is improved; however, increasing the number of sectors increases the memory requirements for lens shading correction. Techniques for improving the precision of lens shading correction factors with reduced memory requirements, while also limiting the need for other system resources, could potentially improve image quality and/or reduce system hardware and energy requirements for lens shading correction.

SUMMARY OF THE DISCLOSURE

Techniques disclosed herein, including methods and apparatus, allow precise lens shading correction with limited data storage and processing through the use of best-fit formulas as opposed to a grid of correction factors associated with a pixel array of image sensor. In some implementations, a lens shading correction circuit uses addition and multiplication operations to calculate lens shading correction factors associated with pixels of a captured image. Some implementations include a formula with nine numerical constants per channel—a large reduction in data storage required for lens shading correction compared to a grid. In addition, processing requirements for lens shading correction can be limited because some implementations only use addition and multiplication operations to determine lens shading correction factors.

In accordance with one aspect of the present disclosure, a method of correcting image data in a lens shading correction circuit includes accessing numerical constants associated with channels of a captured image represented by a pixel array from a memory. The method further includes calculating lens shading correction factors for the captured image for each pixel of a channel in the pixel array according to the x-y pixel position of the pixel based on a lens shading correction formula and the numerical constants. For the channel in the pixel array, the correction formula applies different subsets of the numerical constants to different radial portions of the pixel array. The method also includes performing lens shading correction for the captured image based on the calculated lens shading correction factors to produce corrected image data, and storing the corrected image data in a non-transitory computer-readable medium.

In some implementations of this aspect of the disclosure, calculating lens shading correction factors for the captured image for each pixel of the channel in the pixel array according to the x-y pixel position of the pixel based on the lens shading correction formula comprises using addition and multiplication operations to calculate the lens shading correction factors for the captured image for each pixel of the channel in the pixel array.

In some implementations of this aspect of the disclosure, calculating the lens shading correction factors based on the lens shading correction formula includes accessing a linear look-up table corresponding to mathematical functions of the lens shading correction formula F.

In accordance with one aspect of the present disclosure, an imaging system comprises a lens shading correction circuit configured to access numerical constants associated with channels of a captured image represented by a pixel array from a memory. The lens shading correction circuit is further configured to calculate lens shading correction factors for the captured image for each pixel of a channel in the pixel array according to the x-y pixel position of the pixel based on a lens shading correction formula and the numerical constants. For the channel in the pixel array, the correction formula applies different subsets of the numerical constants to different radial portions of the pixel array. The lens shading correction circuit is further configured to perform lens shading correction for the captured image based on the calculated lens shading correction factors.

In some implementations of this aspect of the disclosure, the lens shading correction circuit comprises multiplier-accumulator configured to calculate the lens shading correction factors according to the x-y pixel position of the pixel based on the lens shading correction formula and the subset of numerical constants using addition and multiplication operations.

In some implementations of this aspect of the disclosure, the lens shading correction circuit comprises a memory storing a linear look-up table corresponding to mathematical functions of the lens shading correction formula F.

In accordance with one aspect of the present disclosure, a non-transitory computer readable medium comprises executable instructions that when executed cause an integrated circuit (IC) fabrication system to fabricate one or more ICs that comprise a lens shading correction circuit. The lens shading correction circuit us structured to access numerical constants associated with channels of a captured image represented by a pixel array from a memory. The lens shading correction circuit is further structured to calculate lens shading correction factors for the captured image for each pixel of a channel in the pixel array according to the x-y pixel position of the pixel based on a lens shading correction formula and the numerical constants. For the channel in the pixel array, the correction formula applies different subsets of the numerical constants to different radial portions of the pixel array. The lens shading correction circuit is further structured to perform lens shading correction for the captured image based on the calculated lens shading correction factors.

BRIEF DESCRIPTION OF THE DRAWINGS

The implementations will be more readily understood in view of the following description when accompanied by the below figures, wherein like reference numerals represent like elements, and wherein.

DETAILED DESCRIPTION OF IMPLEMENTATIONS

Techniques disclosed herein, including methods and apparatus, allow precise lens shading correction with limited data storage and processing through the use of a simple best-fit formula as opposed to a grid of correction factors associated with a pixel array of image sensors. Turning now to the drawings, and as described in detail below, one implementation of the presently disclosed system is a lens shading correction circuit that uses addition and multiplication operations. Some implementations include a formula with nine numerical constants per channel—a large reduction in data storage required for lens shading correction compared to a grid. In addition, some implementations only use addition and multiplication operations to determine lens shading correction factors, such that processing requirements for calculating lens shading correction factors are limited.

Figure 1:
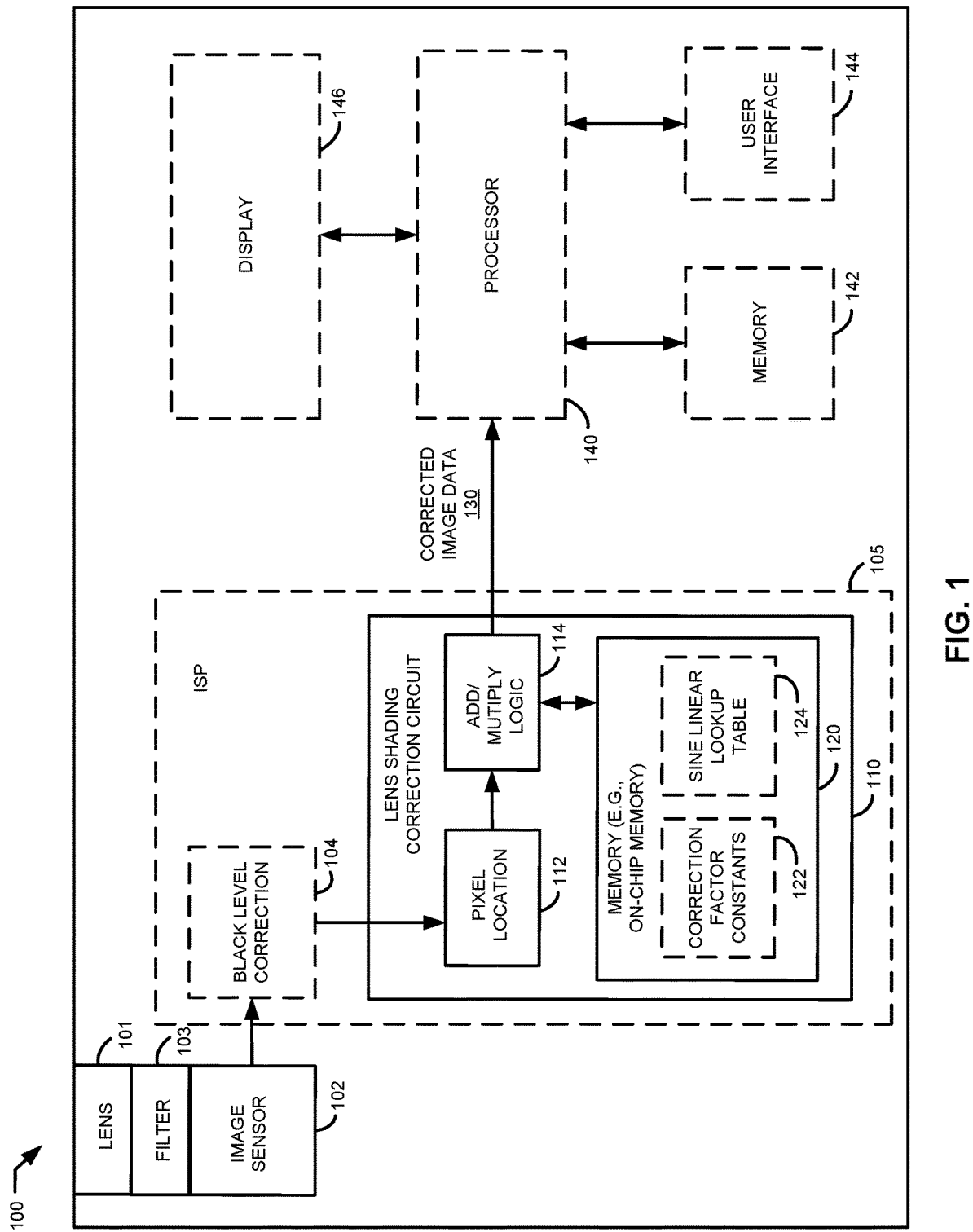
FIG. 1 is a functional block diagram illustrating an example apparatus including a lens shading correction circuit associated with a processor, such as, for example, an image signal processor (ISP), to correct image data.

FIG. 1 is a functional block diagram illustrating an example apparatus 100 including a lens shading correction circuit 110 as described above and in further detail below. In different implementations, the apparatus 100 can be any suitable device with image capturing capability such as, but not limited to, a mobile or smart phone, a phablet, a tablet, a laptop computer, a camera, portable media player, or any other suitable device, including any suitable battery-equipped device, for example.

More specifically, as illustrated in FIG. 1, the apparatus 100 includes a lens 101 paired with an image sensor 102 and a filter 103. The order of pairing is exemplary only. For example, the position of the lens and the filter may be altered in other implementations. The apparatus 100 further includes an ISP 105, an optional general purpose processor 140, an optional memory 142, an optional user interface 144, and an optional display 146. In some implementations, the image sensor 102 includes an analog photodetector with an array of photosensors corresponding to a pixel array. In some implementations, the lens 101 includes an optical lens configured to focus captured light on the image sensor 102. Due to optical distortion in the lens 101, different photosensors in the array of photosensors experience different light intensities based on their positions relative to the lens 101.

In some implementations, the filter 103 represents a color filter array, such as a Bayer filter mosaic. The result of pairing the filter 103 with the image sensor 102 is that each pixel measures incident light of a specific filtered color range (such as red, green or blue light). The output of the image sensor 102 is directed to ISP 105 via an analog to digital converter (not shown). The ISP 105 includes the black level correction unit 104, which, in this implementation, operates prior to lens shading correction, and lens shading correction circuit 110. ISP 105, in some implementations, can further includes a number of additional image correction processes, such as some or all of those illustrated in FIG. 2.

The lens shading correction circuit 110 is configured to calculate lens shading correction factors for an image captured by image sensor 102. The lens shading correction circuit 110 includes a pixel locator 112, add/multiply logic 114 and memory, such as on-chip memory 120, which is static random access memory (SRAM), or another non-transitory computer readable medium. In some implementations, these components are shared for other processes of ISP 105, such as some or all of those illustrated in FIG. 2. The lens shading correction circuit 110 is further configured to perform lens shading correction for the captured image based on the calculated lens shading correction factors, e.g., using the add/multiply logic 114.

The captured image from image sensor 102 is represented by a pixel array. For each pixel of a channel (e.g., red, green or blue), a lens shading correction formula F incorporates the x-y pixel position of the pixel and a subset of numerical constants of correction factor constants 122 to produce a correction factor for the pixel.

In various implementations, the lens shading correction circuit 110 includes a predefined lens shading correction formula F. Best fit values associated with a color channel for the predefined lens shading correction formula F are determined for different radial portions of the predefined lens shading correction formula F through testing of the assembly including the lens 101, the filter 103 and the image sensor 102, or through testing of representative sample(s) a series of lens-photodetector assemblies manufactured under the same design and processes. In some implementations, testing includes capturing an image of a standard light source with the assembly of the lens 101, the filter 103 and the image sensor 102. Once the light source is captured, the known intensity of the light source is used to calculate the best fit values for each of the different radial portions for the predefined lens shading correction formula F for each of the color channels of the assembly of the lens 101, the filter 103 and the image sensor 102. The lens shading correction circuit 110 stores the best fit values as numerical constants in the memory 120 for each of the different radial portions for each of the color channels as represented by correction factor constants 122.

For example, the lens shading correction formula F includes a radial center, which is represented with numerical constants of the correction factor constants 122. In some implementations, the numerical constants define the radial center of the lens shading correction formula F according to the x-y pixel position of the radial center. In the same or different implementations, the radial center for the lens shading correction formula F is the same for more than one color channel, such some or as all color channels, associated with lens 101, filter 103 and image sensor 102. In other implementations, the radial center for the lens shading correction formula F is unique for every color channel, associated with the lens 101, the filter 103 and the image sensor 102.

While testing each of a series of lens-photodetector assemblies manufactured under the same design and processes allows for more precise lens shading correction with the lens shading correction circuit 110, such testing also comes with manufacturing costs. In some implementations, manufacturing includes limited testing of each of the series of lens-photodetector assemblies manufactured under the same design and processes, such as testing to determine the optical center of lens 101, but not testing to determine other unique numerical constants of the predefined lens shading correction formula.

In some theoretical implementations, the lens shading correction formula is represented as:

$$F(r)=a*r*\sin(b*r)+c.$$

The lens shading correction formula $F(r)$ is the fitted lens shading correction gain, whereas r is the radius of each pixel position to the center (either the image center or optical center), a, b, c are three numerical constants which are best fit for each pixel in the pixel array for the color channel; increasing, however, this radial formula $F(r)$ is for an isotropic profile for an ideal lens mounted to an ideal image sensor with an ideal manufacturing process. Thus, it has limited adaptability to variations in standard manufacturing processes or other anisotropic lenses. For example, the optical center is not always aligned with an image (geometry) center, or, for certain lenses the profile of shading itself is anisotropic. For this reason, a more adaptable formula is better-suited to allow calculation of precise correction factors for the pixels in a pixel array for a color channel from the image sensor 102. Accordingly, in various implementations, the lens shading correction circuit 110 incorporates anisotropic formulas that apply different best fit values to different radial portions to more precisely define lens shading correction gain as compared to an isotropic formula, such as the formula $F(r)$ above.

Some implementations of the lens shading correction formula F, such as a anisotropic lens shading correction formula F, incorporates one or more mathematical functions, such as trigonomic functions, such as sine, cosine or tangent functions, or other mathematical functions suitable for providing a radially-centric lens shading correction formula.

In order to limit the processing power and energy consumption required by the lens shading correction circuit 110 to calculate the lens shading correction factor for a pixel of an image, mathematical functions of the lens shading correction formulas are implemented as linear look-up tables, as represented by sine linear lookup table 124 in FIG. 1.

In some specific implementations, the subset of the numerical constants correction factor constants 122 for the channel in the pixel array include $c_1, c_2, c_3, c_4, c_5, c_6, c_7, c_8$, and $c_9$, and wherein:

$$fx = \begin{cases} c_1*(x-ctx)*\sin(c_2*(x-ctx)) & x \leq ctx \\ c_3*(x-ctx)*\sin(c_4*(x-ctx)) & x > ctx \end{cases};$$

$$fy = \begin{cases} c_6*(y-cty)*\sin(c_7*(y-cty)) & y \leq cty \\ c_8*(y-cty)*\sin(c_9*(y-cty)) & y > cty \end{cases};$$

and $$F = fx + fy + c5.$$

The formula F shown above is the fitted lens shading correction gain for four different radial portions. In the formula F, (x,y) are coordinates corresponding to the pixel position in the image, whereas (ctx, cty) represent the center position of the image. In the formula F, the subset of the numerical constants of the correction factor constants 122 for a color channel include nine coefficients ($c_1, c_2, \ldots, c_9$), which are best fit for each pixel in the pixel array for the color channel. In some implementations, the numerical constants of the correction factor constants 122 include a different subset of coefficients for each color channel best fit to the correction factors for the pixels of each color channel, such as at least three of the plurality of channels of the pixel array. In the formula F, the ctx and cty can also be configured as numerical constants in addition to the other eleven coefficients (ctx, cty, $c_1, c_2, \ldots, c_9$). The ctx and cty can be the same for each color channel, or unique for at least some of the color channels.

The formula F conforms to the anisotropic of the lens shading profile itself by allowing for unique numerical constants for each quadrant (one kind of radial portion) of an image field of view to fit the ground truth profile. For example, $c_1, c_2, c_6$, and $c_7$ apply to the quadrant where x≤ctx and y≤cty. Similarly, $c_3, c_4, c_6$, and $c_7$ apply to the quadrant where, x>ctx and y≤cty; $c_1, c_2, c_8$, and $c_9$ apply to the quadrant where, x≤ctx and y>cty; and $c_3, c_4, c_8$, and $c_9$ apply to the quadrant where, x>ctx and y>cty. Thus, implementations that provide for different numerical constants for different radial portions, such as quadrants, can provide for more precise lens shading correction than implementations which apply the same numerical constants for any radial position. Such implementations, including the formula F adapt for asymmetric for up-down or left-right sides, non-concentric circular, nonconcentric elliptical and other variations.

During run time, ISP 105 calculates specific correction factors based on these few parameters and a piece-wise linear (for example, 32 pieces) look-up-table 124 for the sine function of the formula F. The formula F allows for incorporation of non-circular and non-elliptical based functions, which provides more precise correction factors across a pixel array than circular and elliptical based functions.

In the same or different implementations, the lens shading correction circuit 110 uses addition and multiplication operations to calculate the correction factors for the pixels. In some of such implementations, sine functions for the formula F are determined using a sine linear lookup table 124 in memory 120 (or other memory), such that the lens shading correction circuit 110 uses only addition and multiplication operations. In the same or different implementations, the lens shading correction circuit 110 includes a multiplier-accumulator configured to calculate the lens shading correction factors. Thus, the lens shading correction circuit 110 is implemented without using a general purpose processor, thereby limiting both the processing complexity and the energy consumption used for lens shading correction, while drastically reducing the data storage required for precise lens shading correction for the pixels of a pixel array.

The x*sin x components of the formula F are adaptable to precisely fit the nature of shading profile of a lens, by adjusting amplitude with "x" item and frequency with "sin x" item. The alternatives or generalization of the x*sin x based formula include fitting of polynomial, such as from "Taylor expansion" of sin x function, a specific example as formula below, using approximation of the first three items of Taylor expansion:

For $\sin x = x - \frac{x^3}{3!} + \frac{x^5}{5!} + \ldots, -\infty < x < \infty,$ $\mathrm{x} = c'_2(x - ctx)$ or $\mathrm{x} = c'_4(x - ctx),$ having $$fx = \begin{cases} c'_1 * \left(\mathrm{x}^2 - \frac{\mathrm{x}^4}{3!} + \frac{\mathrm{x}^6}{5!}\right), & \mathrm{x} \leq 0 \\ c'_3 * \left(\mathrm{x}^2 - \frac{\mathrm{x}^4}{3!} + \frac{\mathrm{x}^6}{5!}\right), & \mathrm{x} > 0 \end{cases}$$

Moreover, other implementations may include countless other variations and varieties of lens shading correction formulas that provide for different numerical constants for different radial portions to account for anisotropic ground truth profiles. For example, such radial portions may represent bisections, quadrants, as with the formula F, or other radial portions. In various implementations, the lens shading correction formula and corresponding radial portions are selected according to the ground truth profile of the lens, the desired precision of the resulting lens shading correction factors, balanced with desirable memory and processing requirements of the selected formula.

The ISP 105 is located as part of an integrated sensor chip with the image sensor 102, e.g., as with a USB camera module, or as part of another component, such as a system-on-a-chip for apparatus 100. In some implementations, the ISP 105 includes an accelerated processing unit (APU) with one or more CPU cores or one or more general processing unit (GPU) cores on a same die. In alternative implementations, the ISP 105 includes one or more digital signal processors (DSPs), one or more field programmable gate arrays (FPGAs), or one or more application-specific integrated circuits (ASICs), such as one or more multiplier-accumulators. In some implementations, some or all of the functions of the ISP 105 are performed by any suitable processor or combination of processors.

In some implementations, some or all of the ISP 105, including the lens shading correction circuit 110 and any other logic described herein, are implemented by executing suitable instructions on a general purpose processor. In some implementations, the executable suitable instructions are stored on a computer readable storage medium, where the executable instructions are executable by one or more processors to cause the one or more processors to perform the actions described herein. In some implementations, executable instructions are stored on the memory 120 or any other suitable memory that includes lens shading correction code that when executed performs the functions of black level correction unit 104 and the lens shading correction circuit 110 as described herein. In various implementations, some or all of this functionality is implemented in any other suitable manner such as but not limited to a software implementation, a firmware implementation, a hardware implementation, or any suitable combination of the example implementations described above.

Figure 2:
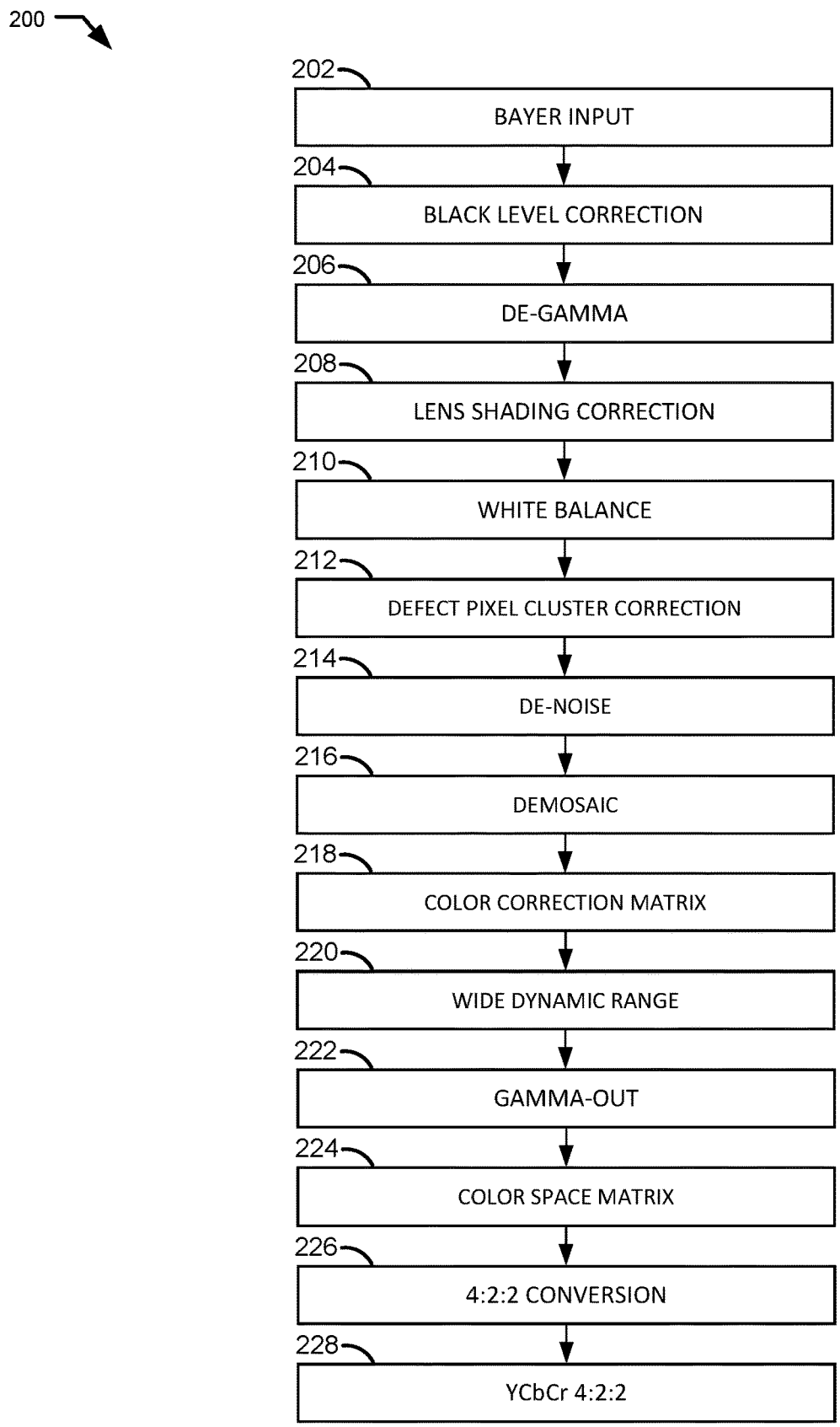
FIG. 2 is a flowchart illustrating an example ISP pipeline including lens shading correction.

FIG. 2 is a flowchart illustrating an example ISP pipeline. The example ISP pipeline includes the lens shading correction techniques of FIG. 3 as lens shading correction 208. The example ISP pipeline 200 is provided to provide context for the lens shading correction techniques described herein.

First, the example ISP pipeline 200 includes the raw digital image data from an image sensor, such as a red-green-blue (RGB) sensor as translated by an analog to digital converter. As indicated this raw digital image data is a Bayer input data 202. Each pixel position only has value for one color channel as each pixel is associated with a specific color.

Next, the example ISP pipeline 200 includes black level correction 204. Black level correction compensates for dark currency in the sensor pixel circuit. Following black level correction 204, the example ISP pipeline 200 includes de-gamma 206. De-gamma 206 is implemented with a look-up table to correct the linearity of pixel signal value according to the luminance variation. The example ISP pipeline 200 includes lens shading correction 208, as described with respect to FIGS. 1 and 3, following de-gamma 206.

Next, the example ISP pipeline 200 includes, white balance 210 and defect pixel cluster correction 212. The defect pixel cluster correction 212 corrects the defect pixel cluster defects resulting from sensor manufacturing.

Next, the example ISP pipeline 200 includes de-noise 214, which is a filter to reduce the noise of signal for each color channel. Following the de-noise 214, the demosaic 216 interpolates Bayer format to a red-green blue (R,G,B) full channel image such that each pixel in the image has R,G,B components. Color correction matrix 218 follows demosaic 216 in the example ISP pipeline 200. The color correction matrix 218 handles the color reproduction to match the human visual perception.

Next, the example ISP pipeline 200 includes wide dynamic range 220, which manages the dynamic range mapping from input image to output image to match human vision perception or better visual effect. Following wide dynamic range 220, the example ISP pipeline 200 includes gamma-out 222, which provides gamma correction for possible display device gap, and color space matrix 224, which supports color space conversion for encoding.

Following color space matrix 224 the example ISP pipeline 200 includes 4:2:2 conversion 226, which provides down-sampling from YcbCr4:4:4 to YCbCr4:2:2. The output of 4:2:2 conversion 226 is YCbCr4:2:2 228.

In this manner, the example ISP pipeline 200 includes a number of image processing steps, including those practiced on single channel pixels (black level correction 204, de-gamma 206, lens shading correction 208, white balance 210, defect pixel cluster correction 212, de-noise 214, and demosaic 216. Following demosaic 216, the example ISP pipeline 200 includes a number of additional image processing steps for the resulting full channel image, including wide dynamic range 220, gamma-out 222, color space matrix 224 and 4:2:2 conversion 226. Each of these processes is merely exemplary, and various other ISP pipelines implementations include include fewer or additional processes in the same or a different order.

Figure 3:
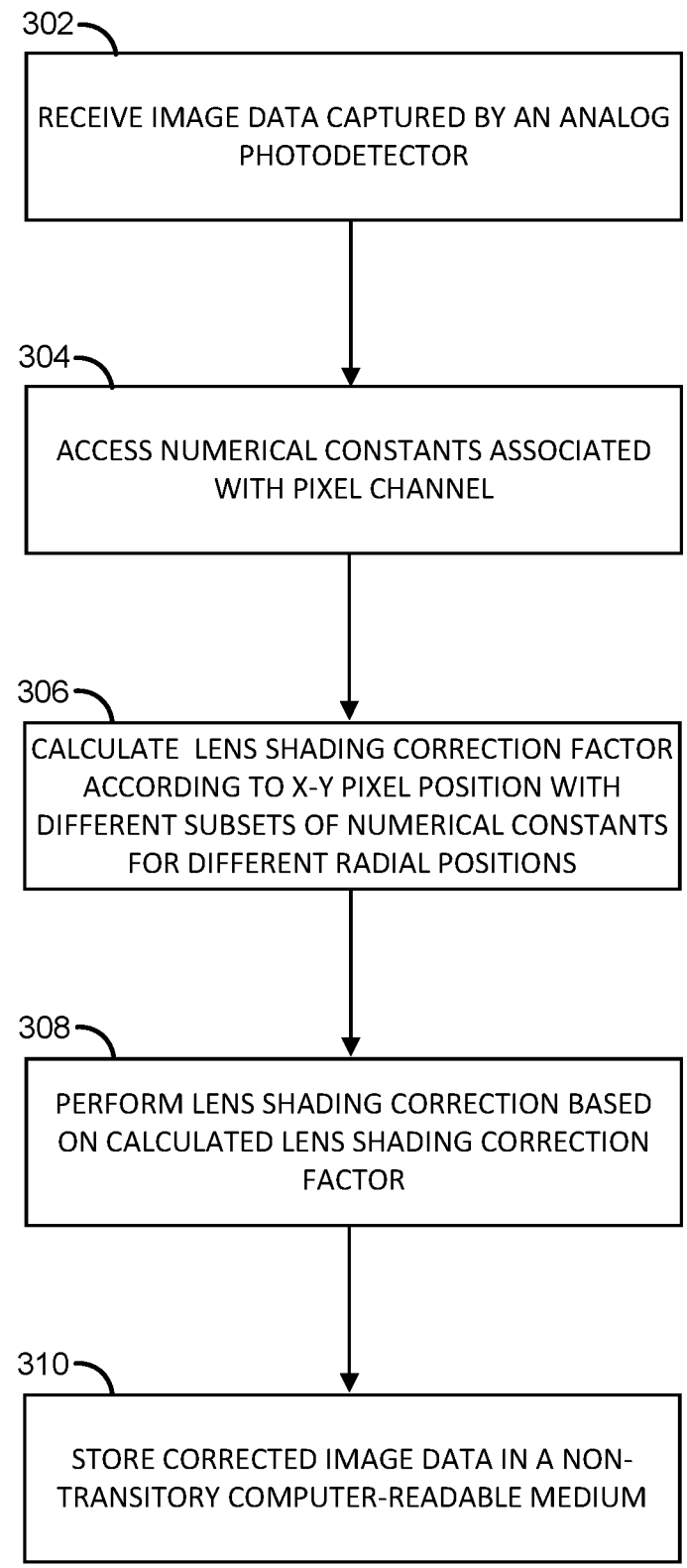
FIG. 3 is a flowchart illustrating an example techniques for lens shading correction using addition and multiplication operations.

FIG. 3 is a flowchart illustrating an example techniques for lens shading correction using addition and multiplication operations. The techniques of FIG. 3 are implemented by executing suitable instructions on one or more processors, such as GPUs, APUs, DSPs, FPGAs, ASICs, such as one or more multiplier-accumulators, and or other processors either integrated with or separate from an image sensor, such as the ISP 105. For clarity, the techniques for FIG. 3 are described with respect to the apparatus 100 and the ISP 105.

To perform lens shading correction, the ISP 105 receives image data captured by an analog photo detector (302). The ISP 105 accesses numerical constants associated with channels of a captured image represented by a pixel array from memory 120 (304).

The ISP 105 calculates lens shading correction factors for the captured image for each pixel of a channel in the pixel array according to the x-y pixel position of the pixel based on a lens shading correction formula and a subset of the correction factor constants 122 (306). For the channel in the pixel array, the correction formula applies different subsets of the numerical constants to different radial portions of the pixel array. The ISP 105 performs lens shading correction for the captured image based on the calculated lens shading correction factors to produce corrected image data 130 (308). The ISP 105 or processor 140, stores the corrected image data 130 in a non-transitory computer-readable medium, such as memory 142 (310).

Figure 4:
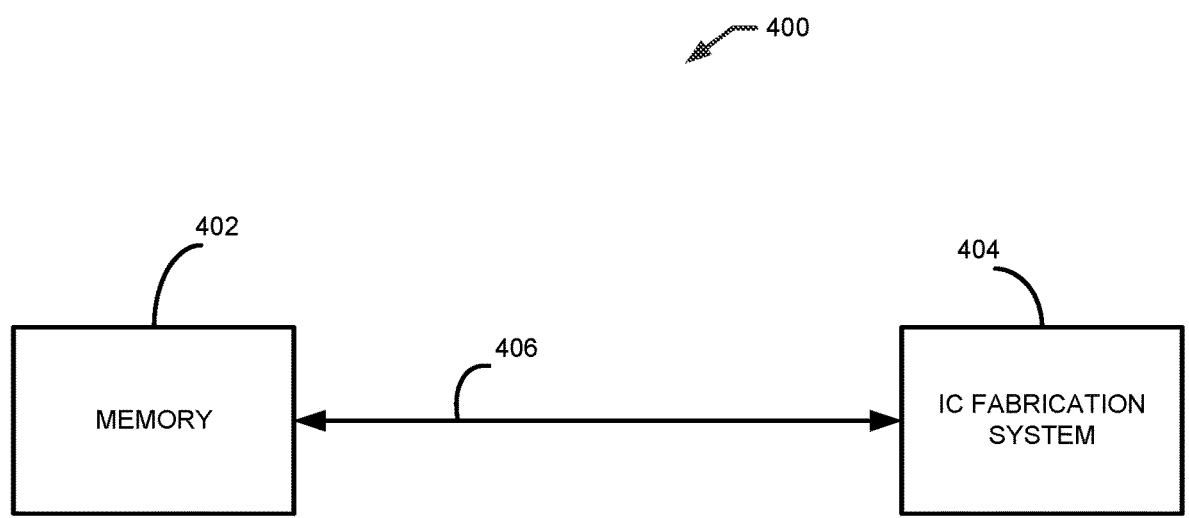
FIG. 4 is a functional block diagram illustrating one example of an integrated circuit fabrication system.

Referring to FIG. 4, an integrated circuit fabrication system 400 is shown. The IC fabrication system 400 includes one or more work stations 404 that control a wafer fabrication to build integrated circuits. Integrated circuit fabrication system 400 further includes memory 402 that are accessed by the one or more work stations 404 via communication link 406. Communication link 406 is in any suitable form and any suitable location accessible via the web, accessible via hard drive, or any other suitable way. The memory 402 is a non-transitory computer readable medium such as but not limited to RAM, ROM, and any other suitable memory. The memory 402 includes thereon instructions that when executed by one or more processors causes the integrated circuit fabrication system 404 to fabricate one or more integrated circuits that include the logic and structure described herein, including ISP 105.

The disclosed integrated circuit designs are employed in any suitable apparatus including, but not limited to, a mobile or smart phone, a phablet, a tablet, a camera, a laptop computer, a portable media player, a set-top box, a printer, or any other suitable device which captures images or corrects image data.

Also, integrated circuit design systems, such as work stations including, as known in the art, one or more processors, associated memory in communication via one or more buses or other suitable interconnect and other known peripherals, are known that create wafers with integrated circuits based on executable instructions stored on a computer readable medium such as but not limited to CDROM, RAM, other forms of ROM, hard drives, distributed memory, etc. The instructions are represented by any suitable language such as but not limited to hardware descriptor language (HDL), Verilog, or other suitable language. As such, in some implementations, the logic and structure described herein are produced as one or more integrated circuits by such systems using the computer readable medium with instructions stored therein. For example, one or more integrated circuits with the logic and structure described above are created using such integrated circuit fabrication systems. In such a system, the computer readable medium stores instructions executable by one or more integrated circuit design systems that causes the one or more integrated circuit design systems to produce one or more integrated circuits. For example, in some implementations, the one or more integrated circuits include one or more of the lens shading correction circuit 110, and any other components described above that correct image data, as described above.

Among other advantages, for example, the disclosed methods and apparatus allow precise lens shading correction with limited data storage and processing through the use of a simple best-fit formula for each color channel of a captured image.

The above detailed description and the examples described therein have been presented for the purposes of illustration and description only and not for limitation. For example, the operations described are done in any suitable manner. It is therefore contemplated that the present implementations cover any and all modifications, variations or equivalents that fall within the scope of the basic underlying principles disclosed above and claimed herein. Furthermore, while the above description describes hardware in the form of a processor executing code, hardware in the form of a state machine or dedicated logic capable of producing the same effect, other structures are also contemplated.

What is claimed is:

1. A method of correcting image data in a lens shading correction circuit, the method comprising:
    accessing stored numerical constants associated with channels of a captured image represented by a pixel array from a memory;
    calculating lens shading correction factors for the captured image for each pixel of a channel in the pixel array according to the x-y pixel position of the pixel based on a lens shading correction formula and the stored numerical constants,
    wherein, for the channel in the pixel array, the correction formula applies different subsets of the stored numerical constants to different radial portions of the pixel array for the channel;
    performing lens shading correction for the captured image based on the calculated lens shading correction factors to produce corrected image data, and
    storing the corrected image data in a non-transitory computer-readable medium.

2. The method of claim 1, wherein calculating lens shading correction factors for the captured image for each pixel of the channel in the pixel array according to the x-y pixel position of the pixel based on the lens shading correction formula comprises using addition and multiplication operations to calculate the lens shading correction factors for the captured image for each pixel of the channel in the pixel array.

3. The method of claim 1, wherein the subset of stored numerical constants for the channel in the pixel array include an x-y pixel position for a radial center of the lens shading correction formula F.

4. The method of claim 1, wherein the lens shading correction formula is anisotropic.

5. The method of claim 1, wherein the subset of stored numerical constants for the channel in the pixel array include best fit values of the lens shading correction formula for the pixels of the channel in the pixel array for each of the different radial portions.

6. The method of claim 1, wherein calculating the lens shading correction factors based on the lens shading correction formula includes accessing a linear look-up table corresponding to mathematical functions of the lens shading correction formula F.

7. The method of claim 1,
    wherein the channel of the pixel array is one of a plurality of channels of the pixel array, the method further comprising calculating lens shading correction factors for each pixel in the pixel array based on different subsets of the stored numerical constants for at least three of the plurality of channels of the pixel array.

8. The method of claim 1, further comprising receiving the captured image from an analog photodetector including an array of photosensors corresponding to the pixel array.

9. The method of claim 1,
    wherein the subset of stored numerical constants for the channel in the pixel array include $c_1, c_2, c_3, c_4, c_5, c_6, c_7, c_8$, and $c_9$, and wherein:

$$fx = \begin{cases} c_1*(x-ctx)*\sin(c_2*(x-ctx)) & x \le ctx \\ c_3*(x-ctx)*\sin(c_4*(x-ctx)) & x > ctx \end{cases};$$

$$fy = \begin{cases} c_6*(y-cty)*\sin(c_7*(y-cty)) & y \le cty \\ c_8*(y-cty)*\sin(c_9*(y-cty)) & y > cty \end{cases};$$

and $$F = fx + fy + c5.$$

10. An imaging system comprising:
a lens shading correction circuit configured to:
  access stored numerical constants associated with channels of a captured image represented by a pixel array from a memory;
  calculate lens shading correction factors for the captured image for each pixel of a channel in the pixel array according to the x-y pixel position of the pixel based on a lens shading correction formula and the stored numerical constants,
  wherein, for the channel in the pixel array, the correction formula applies different subsets of the stored numerical constants to different radial portions of the pixel array for the channel; and
  perform lens shading correction for the captured image based on the calculated lens shading correction factors.

11. The imaging system of claim 10, wherein the lens shading correction circuit comprises multiplier-accumulator configured to calculate the lens shading correction factors according to the x-y pixel position of the pixel based on the lens shading correction formula and the subset of stored numerical constants using addition and multiplication operations.

12. The imaging system of claim 10, wherein the subset of stored numerical constants for the channel in the pixel array include an x-y pixel position for a radial center of the lens shading correction formula F.

13. The imaging system of claim 10, wherein the lens shading correction formula is anisotropic.

14. The imaging system of claim 10, wherein the subset of stored numerical constants for the channel in the pixel array include best fit values of the lens shading correction formula for the pixels of the channel in the pixel array for each of the different radial portions.

15. The imaging system of claim 10, wherein the lens shading correction circuit comprises a memory storing a linear look-up table corresponding to mathematical functions of the lens shading correction formula.

16. The imaging system of claim 10,
wherein the channel of the pixel array is one of a plurality of channels of the pixel array, and
wherein the lens shading correction circuit is configured calculate lens shading correction factors for each pixel in the pixel array based on different subsets of the stored numerical constants for at least three of the plurality of channels of the pixel array.

17. The imaging system of claim 10, further comprising a memory storing the stored numerical constants for the channel of the pixel array.

18. The imaging system of claim 10, further comprising:
an analog photodetector operable to capture the captured image, the analog photodetector including an array of photosensors corresponding to the pixel array; and
an optical lens configured to focus captured light on the analog photodetector.

19. The imaging system of claim 10,
wherein the subset of stored numerical constants for the channel in the pixel array include $c_1$, $c_2$, $c_3$, $c_4$, $c_5$, $c_6$, $c_7$, $c_8$, and $c_9$, and wherein:

$$fx = \begin{cases} c_1*(x-ctx)*\sin(c_2*(x-ctx)) & x \le ctx \\ c_3*(x-ctx)*\sin(c_4*(x-ctx)) & x > ctx \end{cases};$$

$$fy = \begin{cases} c_6*(y-cty)*\sin(c_7*(y-cty)) & y \le cty \\ c_8*(y-cty)*\sin(c_9*(y-cty)) & y > cty \end{cases};$$

and $$F = fx + fy + c5.$$

20. A non-transitory computer readable medium comprising executable instructions that when executed cause an integrated circuit (IC) fabrication system to fabricate one or more ICs that comprise:
a lens shading correction circuit structured to:
  access stored numerical constants associated with channels of a captured image represented by a pixel array from a memory;
  calculate lens shading correction factors for the captured image for each pixel of a channel in the pixel array according to the x-y pixel position of the pixel based on a lens shading correction formula and the stored numerical constants,
  wherein, for the channel in the pixel array, the correction formula applies different subsets of the stored numerical constants to different radial portions of the pixel array for the channel; and
  perform lens shading correction for the captured image based on the calculated lens shading correction factors.

* * * * *